United States Patent
Kitahara

(10) Patent No.: US 12,538,422 B2
(45) Date of Patent: Jan. 27, 2026

(54) CIRCUIT BOARD AND CIRCUIT MODULE

(71) Applicant: Murata Manufacturing Co., Ltd., Nagaokakyo (JP)

(72) Inventor: Takashi Kitahara, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 218 days.

(21) Appl. No.: 18/338,439

(22) Filed: Jun. 21, 2023

(65) Prior Publication Data
US 2023/0337359 A1    Oct. 19, 2023

Related U.S. Application Data

(63) Continuation of application No. PCT/JP2021/046915, filed on Dec. 20, 2021.

(30) Foreign Application Priority Data

Jan. 6, 2021    (JP) ................. 2021-000928

(51) Int. Cl.
*H05K 1/11*   (2006.01)
*H05K 1/18*   (2006.01)

(52) U.S. Cl.
CPC ............. *H05K 1/111* (2013.01); *H05K 1/181* (2013.01); *H05K 2201/093* (2013.01); *H05K 2201/09409* (2013.01)

(58) Field of Classification Search
CPC .. H05K 1/111; H05K 1/181; H05K 2201/093; H05K 2201/09409; H05K 2201/09381; H05K 2201/09427; H05K 2201/09745; H05K 1/141; H01L 23/12
See application file for complete search history.

(56) References Cited

U.S. PATENT DOCUMENTS

| | | | |
|---|---|---|---|
| 6,960,824 B1 * | 11/2005 | Hashemi | H01L 23/3677 257/E23.105 |
| 2001/0018982 A1 | 9/2001 | Gotoh et al. | |
| 2007/0013083 A1 | 1/2007 | Kikuchi et al. | |

(Continued)

FOREIGN PATENT DOCUMENTS

| | | |
|---|---|---|
| JP | H11-40942 A | 2/1999 |
| JP | 2007-027287 A | 2/2007 |

(Continued)

OTHER PUBLICATIONS

International Search Report for PCT/JP2021/046915 dated Mar. 15, 2022.

*Primary Examiner* — Ishwarbhai B Patel
(74) *Attorney, Agent, or Firm* — McDonald Hopkins LLC

(57) ABSTRACT

A circuit board includes a grounding land conductor that is provided on a first main surface of a base material, and overlaps with a region in which an electronic component of a bump connection type is mounted, when viewed in a direction perpendicular to the first main surface. The grounding land conductor includes a mounting pad portion on which a bump of the electronic component is mounted, a common portion that overlaps with the electronic component, when viewed in the direction perpendicular to the main surface, and a connecting portion that connects the mounting pad portion and the common portion and is smaller in width than the mounting pad portion.

20 Claims, 5 Drawing Sheets

(56) References Cited

U.S. PATENT DOCUMENTS

| | | | |
|---|---|---|---|
| 2008/0236871 A1* | 10/2008 | Schaefer | ............... H05K 3/341 |
| | | | 174/250 |
| 2009/0115050 A1* | 5/2009 | Kasuya | .............. H01L 23/3677 |
| | | | 257/701 |
| 2011/0019379 A1 | 1/2011 | Shibuya | |

FOREIGN PATENT DOCUMENTS

| | | |
|---|---|---|
| JP | 2009-054829 A | 3/2009 |
| JP | 2011-029287 A | 2/2022 |

* cited by examiner

CIRCUIT BOARD AND CIRCUIT MODULE

CROSS REFERENCE TO RELATED APPLICATION

This is a continuation of International Application No. PCT/JP2021/046915 filed on Dec. 20, 2021 which claims priority from Japanese Patent Application No. 2021-000928 filed on Jan. 6, 2021. The contents of these applications are incorporated herein by reference in their entireties.

BACKGROUND OF THE DISCLOSURE

Field of the Disclosure

The present disclosure relates to a circuit board including a mounting land conductor on which an electronic component is mounted.

Description of the Related Art

Patent Literature 1 discloses a printed wiring board. The printed wiring board disclosed in Patent Literature 1 includes a plurality of lands in a region in which an electronic component is to be mounted.

The plurality of lands have the same shape and are placed in a predetermined two-dimensional array.

Patent Literature 1

Japanese Unexamined Patent Application Publication No. 2011-29287

BRIEF SUMMARY OF THE DISCLOSURE

In a case in which a ground terminal of the electronic component to be installed (mounted) includes a plurality of ground terminals, on the printed wiring board disclosed in Patent Literature 1, a land may be individually provided to each of the plurality of ground terminals. In addition, a common grounding land may be provided to the plurality of ground terminals.

In a case in which such a common grounding land is provided, an opening corresponding to a plurality of ground terminals has to be provided by a resist film, for example. Without such an opening, solder spreads to the common grounding land, which easily causes bonding failure. In addition, a distance between the electronic component and the printed wiring board is reduced, which makes it impossible to sufficiently fill an insulating resin or the like between the electronic component and the printed wiring board, resulting in a reduction in reliability.

On the other hand, when the resist film is provided, the shortest distance between adjacent electronic components is unable to be reduced, which makes high-density mounting more difficult.

Therefore, exemplary embodiments of the present disclosure provide a circuit board that achieves high-density mounting of an electronic component and significantly reduces bonding failure of connection between the electronic component and the circuit board (a printed wiring board) and a reduction in reliability.

A circuit board includes an insulating base material including a first main surface, and a plurality of land conductors provided on the first main surface. The plurality of land conductors include a grounding land conductor that overlaps with a region in which a first electronic component of a bump connection type is mounted, when viewed in a direction perpendicular to the first main surface. The grounding land conductor includes a mounting pad portion on which a bump of the first electronic component is mounted, a common portion that overlaps with the first electronic component, when viewed in the direction perpendicular to the first main surface, and a connecting portion that connects the mounting pad portion and the common portion and is smaller in width than the mounting pad portion.

With this configuration, the mounting pad portion according to the shape of the bump of the first electronic component is connected to the common portion by the connecting portion of which the width is small. That is to say, even when solder is provided in the mounting pad portion without an opening by a resist film or the like, solder is difficult to flow into the common portion. On the other hand, the mounting pad portion is connected to the common portion, the mounting pad portion electrically functions as a ground.

According to exemplary embodiments of the present disclosure, high-density mounting of an electronic component is achieved, and bonding failure of connection between the electronic component and a circuit board (a printed wiring board) and a reduction in reliability are able to be significantly reduced.

DETAILED DESCRIPTION OF THE DISCLOSURE

First Exemplary Embodiment

A circuit board and a circuit module according to a first exemplary embodiment of the present disclosure will be described with reference to drawings.
(Configuration of Circuit Module)

Figure 1:
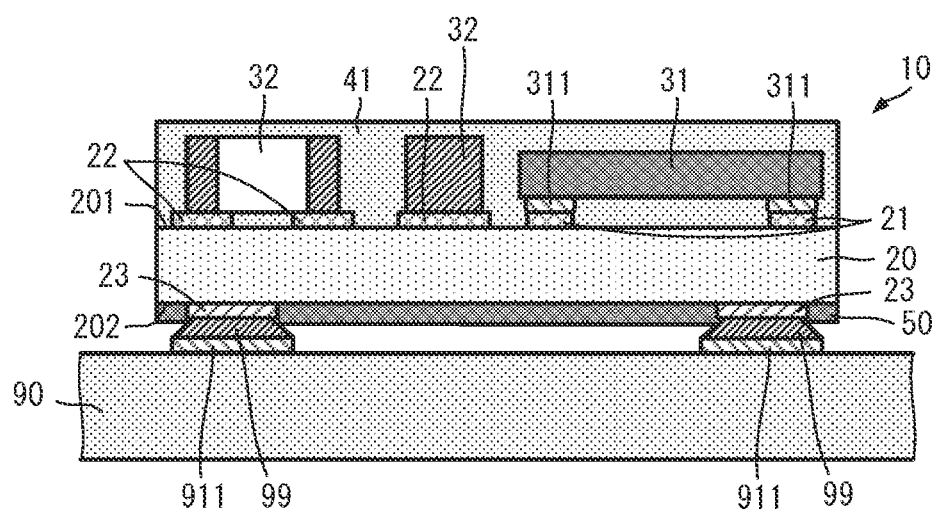
FIG. 1 is a side cross-sectional view showing a configuration of a circuit module 10 according to a first exemplary embodiment of the present disclosure.

FIG. 1 is a side cross-sectional view showing a configuration of a circuit module 10 according to the first exemplary embodiment of the present disclosure. As shown in FIG. 1, the circuit module 10 includes a circuit board 20, an electronic component 31, an electronic component 32, an insulating resin 41, and an insulating resist film 50.

The circuit board 20 includes an insulating base material. The insulating base material is made of an insulating resin, low-temperature firing ceramics, or the like, for example.

The circuit board 20 includes a first main surface 201 and a second main surface 202. The second main surfaces 202 is a surface opposite to the first main surface 201 of the circuit board 20. A circuit conductor pattern (not shown) to achieve the circuit module 10 is provided on the circuit board 20.

A mounting land conductor 21 and a mounting land conductor 22 are provided on the first main surface 201. The mounting land conductor 21 is a land conductor for the electronic component 31. The mounting land conductor 22 is a land conductor for the electronic component 32. The specific shape of the mounting land conductor 21 and the mounting land conductor 22 will be described below.

The mounting land conductor 21 and the mounting land conductor 22 are made of copper, for example. Surface-mount plating is not provided on a surface of the mounting land conductor 21 and the mounting land conductor 22. Furthermore, the resist film is not provided on the first main surface 201.

A plurality of terminal conductors 23 are provided on the second main surface 202.

The electronic component 31 includes a plurality of bumps 311 near a mounting surface. That is to say, the electronic component 31 is an electronic component of a bump connection type. The electronic component 31 corresponds to a "first electronic component" of the present disclosure. The electronic component 31 is mounted on the first main surface 201 of the circuit board 20 by the plurality of bumps 311 bonded to the mounting land conductor 21 by use of solder or the like.

The electronic component 32 is an electronic component in which a terminal conductor of the electronic component 32 is provided on an outer surface of a housing. The electronic component 32 is mounted on the first main surface 201 of the circuit board 20 by the terminal conductor of the electronic component 32 bonded to the mounting land conductor 22 by use of solder or the like.

The insulating resin 41 is a so-called resin mold. The insulating resin 41 covers a side of the first main surface 201 of the circuit board 20. At this time, the insulating resin 41 covers the entirety of the electronic component 31 and the electronic component 32 except for a portion to be bonded to the circuit board 20 in the electronic component 31 and the electronic component 32. It is to be noted that a conductive shield film may be provided on a surface (an outer surface) of the insulating resin 41.

The resist film 50 is thinner than the circuit board 20 and covers a side of the second main surface 202 of the circuit board 20. The resist film 50 includes an opening so as to cause the plurality of terminal conductors 23 to be exposed to the outside.

The circuit module 10 of such a configuration is mounted on another circuit board such as a mother board 90. More specifically, the plurality of terminal conductors 23 of the circuit module 10 are bonded to a circuit module land conductor 911 on a surface of the mother board 90 by use of solder 99 or the like.

(Details of Land Conductor Pattern of Circuit Board)

Figure 2:
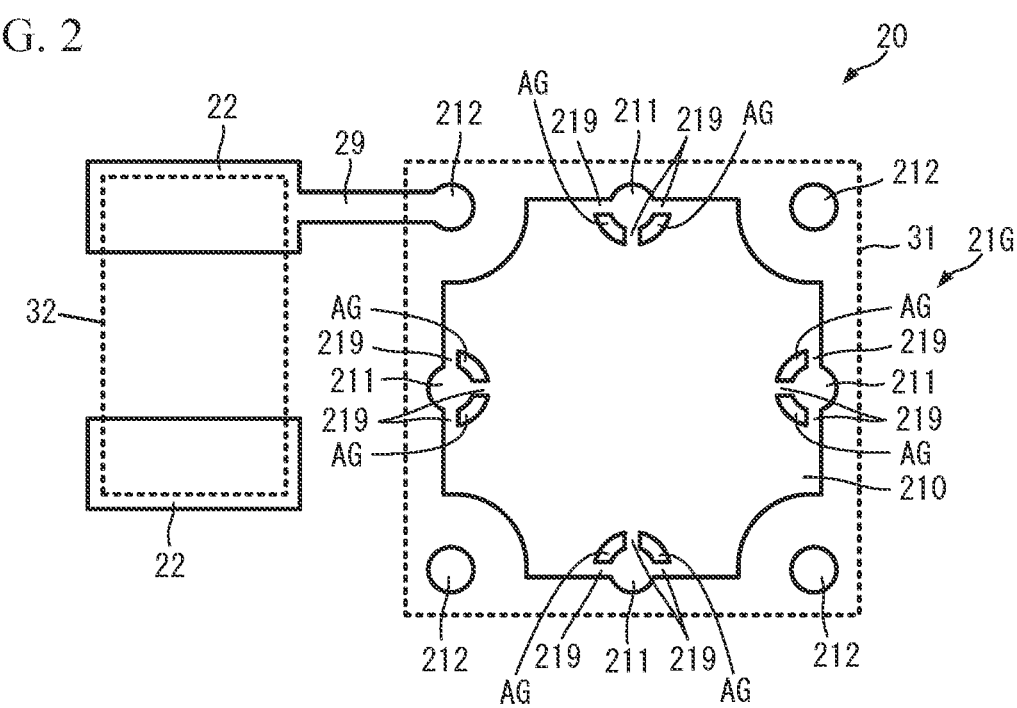
FIG. 2 is a plan view partially showing a land conductor pattern of a circuit board 20 according to the first exemplary embodiment of the present disclosure.

FIG. 2 is a plan view partially showing a land conductor pattern of a circuit board 20 according to the first exemplary embodiment of the present disclosure.

As shown in FIG. 2, the circuit board 20 includes a grounding land conductor 21G and a plurality of signal land conductors 212, as the mounting land conductor 21.

The grounding land conductor 21G and the plurality of signal land conductors 212 are provided at positions that overlap with the electronic component 31, when viewed in the direction perpendicular to the first main surface 201 (in a plan view). The grounding land conductor 21G and the plurality of signal land conductors 212 are placed in a predetermined two-dimensional array pattern. The plurality of signal land conductors 212 each have the same shape or substantially the same shape as the bump 311 of the electronic component 31, and have a circular shape in the present exemplary embodiment.

As a more specific example, in the case of FIG. 2, the plurality of signal land conductors 212 are placed in a quadrangle, in a plan view. The grounding land conductor 21G is placed in a region surrounded by the plurality of signal land conductors 212.

A signal land conductor 212 in the vicinity of the mounting land conductor 22, among the plurality of signal land conductors 212, is connected by a component-to-component wiring conductor 29.

The grounding land conductor 21G includes a common portion 210, a plurality of mounting pad portions 211, and a plurality of connecting portions 219. The common portion 210 is provided over substantially the entire region surrounded by the plurality of signal land conductors 212.

At this time, the common portion 210 is provided so as to be spaced apart by a predetermined distance from the plurality of signal land conductors 212. As a result, undesired electromagnetic coupling between the common portion 210 and the plurality of signal land conductor 212 is significantly reduced or prevented.

The plurality of mounting pad portions 211 each have the same shape or substantially the same shape as the bump 311 of the electronic component 31. That is to say, the plurality of mounting pad portions 211 have the same shape or substantially the same shape as the plurality of signal land conductors 212, and have a circular shape in the present exemplary embodiment.

The plurality of mounting pad portions 211, for example, are placed on the side of the quadrangle configured by the plurality of signal land conductors 212. As a more specific example, the mounting pad portions 211 are placed in an intermediate position on the side.

The plurality of mounting pad portions 211 are spaced apart from the common portion 210 through a gap AG, except for a position in which the plurality of connecting portions 219 are provided.

The plurality of connecting portions 219 are linear conductor patterns. The plurality of connecting portions 219 connect the plurality of mounting pad portions 211 and the common portion 210. It is to be noted that the linear conductor patterns are conductor patterns shaped so as to extend in a predetermined direction, and having a width smaller than the diameter of the mounting pad portions 211. In a case in which the mounting pad portions 211 have no circular shape, the width of the connecting portion 219 is smaller than a length of the longest part (a diagonal line or the like in a case of the quadrangle, for example) in the mounting pad portions 211.

Two or more among the plurality of connecting portions 219 are placed for one mounting pad portion 211. The two or more connecting portions 219 to be connected to the one mounting pad portion 211 are placed at predetermined intervals along the outer periphery of the mounting pad portion 211.

(Mounting Aspect of Electronic Component 31 to Mounting Land Conductor 21)

A plurality of bumps 311 of the electronic component 31 are mounted (bonded) to such a mounting land conductor 21 as follows. The electronic component 31, in a plan view, is placed so as to overlap with the plurality of signal land conductors 212 and the grounding land conductor 21G. The plurality of bump 311 for signals in the electronic component 31 are placed so as to overlap with the plurality of signal land conductors 212. In addition, a plurality of grounding bump 311 in the electronic component 31 are placed so as to overlap with the plurality of mounting pad portions 211 of the grounding land conductor 21G.

Flux treatment is performed on surfaces of the plurality of signal land conductors 212 and the plurality of mounting pad portions 211. The flux treatment is not performed on a surface of the common portion 210 of the grounding land conductor 21G. It is to be noted that the flux treatment may be performed on surfaces of the plurality of connecting portions 219 of the grounding land conductor 21G, but is not performed positively.

In such a configuration, solder is applied to the surfaces of the plurality of signal land conductors 212 and the plurality of mounting pad portions 211 on which the flux treatment has been performed, and the electronic component 31 is placed on the surfaces. Next, the solder used for application and the solder of the bump 311 of the electronic component 31 are melted by heat treatment, which thus mounts (bonds) the electronic component 31 to the circuit board 20.

With such a configuration, in the grounding land conductor 21G, melted solder substantially remains in the plurality of mounting pad portions 211, which significantly reduces or prevents the solder from flowing to the common portion 210.

As a result, an undesired flow of the solder is able to be significantly reduced or prevented, and the electronic component 31 is more reliably mounted (bonded) to the circuit board 20.

In addition, as shown in FIG. 1, the electronic component 31 is mounted with a predetermined gap, to the circuit board 20. As a result, as shown in FIG. 1, the insulating resin 41 reliably enters between the electronic component 31 and the first main surface 201 of the circuit board 20. Accordingly, the reliability of the circuit module 10 is improved.

In addition, in this configuration, the resist film 50 is not provided near the first main surface 201 of the circuit board 20. Therefore, a distance of the mounting land conductor 21 and the mounting land conductor 22 is able to be reduced. As a result, the circuit module 10 is able to mount the electronic component with high density.

In addition, a conductor to be exposed at the side of the first main surface 201 of the circuit board 20, although being provided with no resist film 50, is covered with the insulating resin 41. Therefore, the insulating resin 41 protects the conductor exposed at the side of the first main surface 201 of the circuit board 20. As a result, the reliability of the circuit module 10 is improved.

It is to be noted that it is also possible to apply the configuration of the common portion 210 of the above grounding land conductor 21G, the mounting pad portion 211, and the plurality of connecting portions 219, to the plurality of terminal conductors 23 for grounding. However, as shown in FIG. 1, in an aspect in which an opening is provided in the resist film 50 and the plurality of terminal conductors 23 is exposed, when the configuration of the above grounding land conductor 21G is employed, the shape of the solder provided on the plurality of terminal conductors 23 is difficult to stabilize. Therefore, it is preferable not to employ the configuration of the grounding land conductor 21G to the plurality of terminal conductors 23 for grounding. In addition, in such a case, it is preferable to provide plating for solder on a surface of the plurality of terminal conductors 23.

In addition, the above exemplary embodiment describes that the bump 311 of the electronic component 31 is bonded to the mounting pad portion 211 and is not bonded to the common portion 210. In such a case, a part of a conductive bonding material (solder, for example) configuring the bump 311 may reach the plurality of connecting portions 219. The conductive bonding material configuring the bump 311 extends to the plurality of connecting portions 219, so that, for example, a bonded area is increased and bonding reliability is able to be improved while an undesired large spread of the conductive bonding material is significantly reduced or prevented.

Second Exemplary Embodiment

Figure 3:
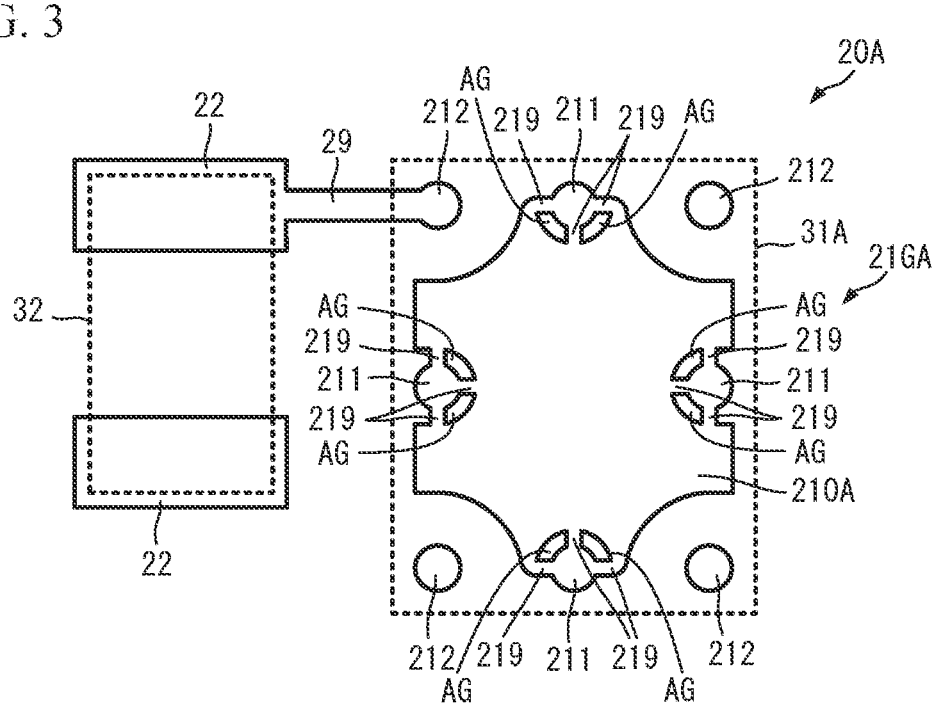
FIG. 3 is a plan view partially showing a land conductor pattern of a circuit board 20A according to a second exemplary embodiment of the present disclosure.

A circuit board and a circuit module according to a second exemplary embodiment of the present disclosure will be described with reference to drawings. FIG. 3 is a plan view partially showing a land conductor pattern of a circuit board 20A according to the second exemplary embodiment of the present disclosure.

As shown in FIG. 3, the circuit boards 20A according to the second exemplary embodiment is different in the configuration of a grounding land conductor 21GA from the circuit board 20 according to the first exemplary embodiment. Other configurations of the circuit board 20A are the same as or similar to the configurations of the circuit board 20, and a description of the same or similar configurations will be omitted.

An electronic component 31A to be mounted on the circuit board 20A has a shape in which a length in a first direction is smaller than a length in a second direction perpendicular to the first direction. A distance between bumps in the first direction is smaller than a distance between bumps in the second direction.

In order to mount such an electronic component 31A, in the grounding land conductor 21GA of the circuit board 20A, a distance between the signal land conductors 212 and the mounting pad portion 211 that are arranged in the first direction is smaller than a distance between the signal land conductors 212 and the mounting pad portion 211 that are arranged in the second direction.

In such a configuration, as shown in FIG. 3, the mounting pad portion 211 placed in the position arranged in the first direction is placed in a position protruding from the outer shape of the common portion 210A. As a result, even when the distance between the signal land conductors 212 and the mounting pad portion 211 is small, the signal land conductors 212 and the grounding land conductor 21GA are easily spaced apart by a predetermined distance or more.

In addition, as shown in FIG. 3, the mounting pad portion 211 placed in the position arranged in the second direction is placed in a position inside the outer shape of the common portion 210A. In other words, the common portion 210A is provided to between the mounting pad portion 211 and the signal land conductors 212 that are arranged in the second direction. Then, this part has a predetermined length in the second direction. As a result, the grounding land conductor 21GA is able to be provided over a larger area in a region that overlaps with the electronic component 31. Therefore, the circuit board 20A improves ground stability to the electronic component 31.

Third Exemplary Embodiment

Figure 4:
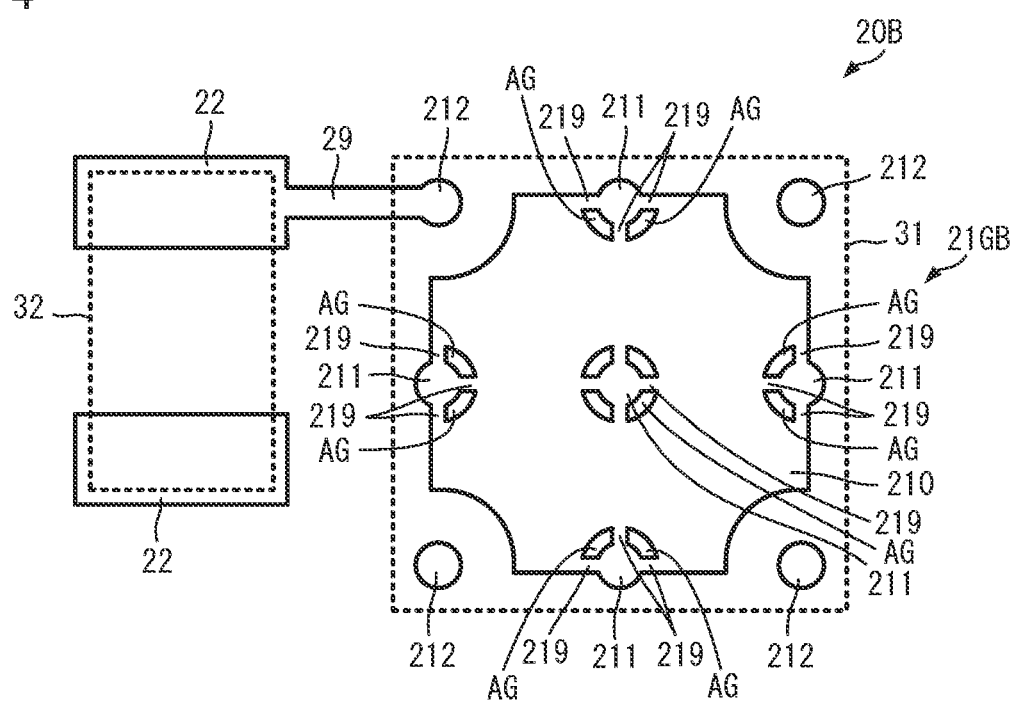
FIG. 4 is a plan view partially showing a land conductor pattern of a circuit board 20B according to a third exemplary embodiment of the present disclosure.

A circuit board and a circuit module according to a third exemplary embodiment of the present disclosure will be described with reference to drawings. FIG. 4 is a plan view partially showing a land conductor pattern of a circuit board 20B according to the third exemplary embodiment of the present disclosure.

As shown in FIG. 4, the circuit boards 20B according to the third exemplary embodiment is different in the configuration of a grounding land conductor 21GB from the circuit board 20 according to the first exemplary embodiment. Other configurations of the circuit board 20B are the same as or similar to the configurations of the circuit board 20, and a description of the same or similar configurations will be omitted.

The circuit board 20B includes a grounding land conductor 21GB. The grounding land conductor 21GB is different from the grounding land conductor 21G according to the first exemplary embodiment in that a mounting pad portion 211 is further provided substantially in the center of the common portion 210. Other configurations of the grounding land conductor 21GB are the same as or similar to the configurations of the grounding land conductor 21G, and a description of the same or similar configurations will be omitted.

The mounting pad portion 211 in the center is spaced apart from the common portion 210 through the gap AG, except for a portion to connect the plurality of connecting portions 219. The plurality of connecting portions 219 are radiately provided at predetermined intervals along the outer periphery of the mounting pad portion 211 in the center. The plurality of connecting portions 219 connect the plurality of mounting pad portions 211 in the center and the common portion 210.

With such a configuration, even when a further bump 311 of the electronic component 31 is present at a position that overlaps with the common portion 210, a new mounting pad portion 211 added in the present exemplary embodiment is reliably bonded to the further bump 311.

Fourth Exemplary Embodiment

Figure 5:
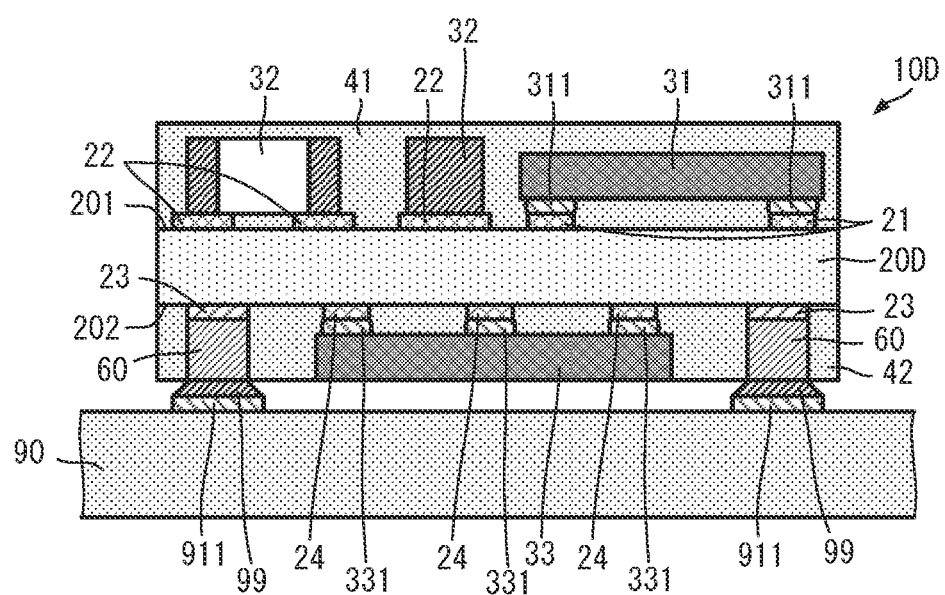
FIG. 5 is a side cross-sectional view showing a configuration of a circuit module 10D according to a fourth exemplary embodiment of the present disclosure.

A circuit board and a circuit module according to a fourth exemplary embodiment of the present disclosure will be described with reference to drawings. FIG. 5 is a side cross-sectional view showing a configuration of a circuit module 10D according to the fourth exemplary embodiment of the present disclosure.

As shown in FIG. 5, the circuit module 10D according to the fourth exemplary embodiment is different from the circuit module 10 according to the first exemplary embodiment in that a mounting type is a double-sided mounting type. Other configurations of the circuit module 10D are the same as or similar to the configurations of the circuit module 10, and a description of the same or similar configuration will be omitted.

The circuit module 10D includes a circuit board 20D, an electronic component 33, an insulating resin 42, and a conductive post 60. The circuit board 20D includes a mounting land conductor 24 on the second main surface 202.

The electronic component 33 includes a plurality of bumps 331 near a mounting surface. That is to say, the electronic component 33 is an electronic component of a bump connection type. The electronic component 33 corresponds to a "second electronic component" of the present disclosure. The electronic component 33 is mounted on the second main surface 202 of the circuit board 20D by the plurality of bumps 331 bonded to the mounting land conductor 24 by use of solder or the like.

The conductive post 60 is provided on the surface of the plurality of terminal conductors 23.

The insulating resin 42 is a so-called resin mold. The insulating resin 42 covers a side of the second main surface 202 of the circuit board 20D. At this time, the insulating resin 42 covers the entirety of the electronic component 33 and the conductive post 60, except for a portion to be bonded to the circuit board 20D in the electronic component 33 and the conductive post 60 and a surface opposite to a mounting side to the circuit board 20D in the conductive post 60.

The circuit module 10D is mounted on the mother board 90 by bonding an exposed surface of the conductive post 60 to the circuit module land conductor 911 by the solder 99.

Even the circuit module 10D of such a double-sided mounting type employs the same configuration as in the circuit module 10 of a one-sided mounting type near the first main surface 201 of the circuit board 20D, and is able to obtain the same advantageous functions and effects. At this time, the same configuration as the configuration near the first main surface 201 may also be applied to a side of the second main surface 202 of the circuit board 20D. That is to say, the same configuration as the configuration of the grounding land conductor of the electronic component 31 may be applied to the grounding land conductor for the electronic component 33.

10, 10D: circuit module
20, 20A, 20B, 20D: circuit board
21, 22, 24: mounting land conductor
21G, 21GA, 21GB: grounding land conductor
23: terminal conductor
29: component-to-component wiring conductor
31, 31A, 32, 33: electronic component
41, 42: insulating resin
50: resist film
60: conductive post
90: mother board
99: solder
201: first main surface
202: second main surface
210 210A: common portion
211: mounting pad portion
212: signal land conductor
219: connection portion
311, 331: bump
911: circuit module land conductor
AG: gap

The invention claimed is:

1. A circuit board comprising:
an insulating base material including a first main surface; and
a plurality of land conductors provided on the first main surface, wherein:
the plurality of land conductors include a grounding land conductor overlapping with a region in which a first electronic component of a bump connection type is mounted, when viewed in a direction perpendicular to the first main surface; and
the grounding land conductor includes:
a mounting pad portion on which a bump of the first electronic component is mounted;
a common portion overlapping with the first electronic component, when viewed in the direction perpendicular to the first main surface; and
a connecting portion connecting the mounting pad portion and the common portion and being narrower in width than the mounting pad portion, and
the mounting pad portion is arranged on an outer edge of the common portion.

2. The circuit board according to claim 1, wherein the connecting portion includes a plurality of connecting portions.

3. The circuit board according to claim 2, wherein the plurality of connecting portions are placed at predetermined intervals along an outer periphery of the mounting pad portion.

4. The circuit board according to claim 3, wherein:
no resist film is provided on the first main surface; and
a surface of the plurality of land conductors is exposed.

5. The circuit board according to claim 3, wherein the plurality of land conductors comprise copper.

6. The circuit board according to claim 2, wherein:
no resist film is provided on the first main surface; and
a surface of the plurality of land conductors is exposed.

7. The circuit board according to claim 2, wherein the plurality of land conductors comprise copper.

8. The circuit board according to claim 1, wherein:
no resist film is provided on the first main surface; and
a surface of the plurality of land conductors is exposed.

9. The circuit board according to claim 8, wherein a surface of the mounting pad portion is a flux treated surface.

10. The circuit board according to claim 9, wherein the plurality of land conductors comprise copper.

11. The circuit board according to claim 8, wherein the plurality of land conductors comprise copper.

12. The circuit board according to claim 1, wherein the plurality of land conductors comprise copper.

13. A circuit module comprising:
the circuit board according to claim 1; and
the first electronic component, wherein the bump of the first electronic component is bonded to the mounting pad portion.

14. The circuit module according to claim 13, wherein a part of the bump of the first electronic component reaches the connecting portion.

15. The circuit module according to claim 13, further comprising a second electronic component mounted on the first main surface.

16. The circuit module according to claim 15, wherein the circuit board includes:
a second main surface opposite to the first main surface; and
a second electronic component mounted on the second main surface.

17. A circuit module comprising:
the circuit board according to claim 2; and
the first electronic component, wherein the bump of the first electronic component is bonded to the mounting pad portion.

18. A circuit module comprising:
the circuit board according to claim 3; and
the first electronic component, wherein the bump of the first electronic component is bonded to the mounting pad portion.

19. A circuit module comprising:
the circuit board according to claim 8; and
the first electronic component, wherein the bump of the first electronic component is bonded to the mounting pad portion.

20. A circuit module comprising:
the circuit board according to claim 9; and
the first electronic component, wherein the bump of the first electronic component is bonded to the mounting pad portion.

* * * * *